US007879742B2

(12) United States Patent
Tanaka

(10) Patent No.: US 7,879,742 B2
(45) Date of Patent: Feb. 1, 2011

(54) LASER ANNEALING METHOD WHEREIN REFLECTED BEAMS ARE MINIMIZED

(75) Inventor: Koichiro Tanaka, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 255 days.

(21) Appl. No.: 11/596,583

(22) PCT Filed: Jun. 6, 2005

(86) PCT No.: PCT/JP2005/010729

§ 371 (c)(1),
(2), (4) Date: Nov. 15, 2006

(87) PCT Pub. No.: WO2005/122222

PCT Pub. Date: Dec. 22, 2005

(65) Prior Publication Data

US 2008/0008222 A1 Jan. 10, 2008

(30) Foreign Application Priority Data

Jun. 10, 2004 (JP) ............................. 2004-172374

(51) Int. Cl.
*H01L 21/00* (2006.01)
(52) U.S. Cl. ................ 438/795; 438/798; 257/E21.028
(58) Field of Classification Search .................. 438/795, 438/798; 257/E21.028
See application file for complete search history.

(56) References Cited

U.S. PATENT DOCUMENTS 5,005,969 A * 4/1991 Kataoka ..................... 353/122

| 5,932,118 A * | 8/1999 | Yamamoto et al. ..... 219/121.66 |
| 6,300,176 B1 | 10/2001 | Zhang et al. |
| 6,324,016 B1 | 11/2001 | Luster |

(Continued)

FOREIGN PATENT DOCUMENTS

JP 08-088196 4/1996

(Continued)

OTHER PUBLICATIONS

Written Opinion of the International Searching Authority for PCT/JP2005/010729 Dated Sep. 6, 2005.

(Continued)

*Primary Examiner*—Hsien-ming Lee
*Assistant Examiner*—Kevin Parendo
(74) *Attorney, Agent, or Firm*—Nixon Peabody LLP; Jeffrey L. Costellia

(57) ABSTRACT

It is an object of the present invention to provide a laser irradiation technique which can keep the stability of the laser oscillator high and which can perform laser process homogeneously by avoiding the adverse effect due to the return light reflected on an irradiation when, for example, crystallizing with a lens array, and to provide a crystallization method and a method for manufacturing a semiconductor device which use the technique. In the present invention, a laser beam emitted from a laser oscillator is divided into a plurality of beams through a lens array such as a cylindrical lens array, the divided beams pass through opening portions of a slit while being focused at the opening portions and condensed beam is irradiated to an irradiation surface. Thus, the light reflected on the irradiation object can be blocked by using the slit.

28 Claims, 10 Drawing Sheets

U.S. PATENT DOCUMENTS

| | | |
|---|---|---|
| 6,689,651 B2 | 2/2004 | Zhang et al. |
| 6,961,361 B1 | 11/2005 | Tanaka |
| 7,078,281 B2 | 7/2006 | Tanaka et al. |
| 2003/0017658 A1* | 1/2003 | Nishitani et al. ............ 438/149 |
| 2003/0203656 A1* | 10/2003 | Kasahara et al. ............ 438/795 |
| 2004/0174512 A1* | 9/2004 | Toyoda et al. ................. 355/67 |
| 2004/0198072 A1 | 10/2004 | Zhang et al. |
| 2004/0233411 A1* | 11/2004 | Shiraishi ...................... 355/67 |
| 2004/0266223 A1 | 12/2004 | Tanaka et al. |

FOREIGN PATENT DOCUMENTS

| | | |
|---|---|---|
| JP | 2000-269161 | 9/2000 |

OTHER PUBLICATIONS

International Search Report for PCT/JP2005/010729 Dated Sep. 6, 2005.

* cited by examiner

Top View

Side View

Side View

Top View

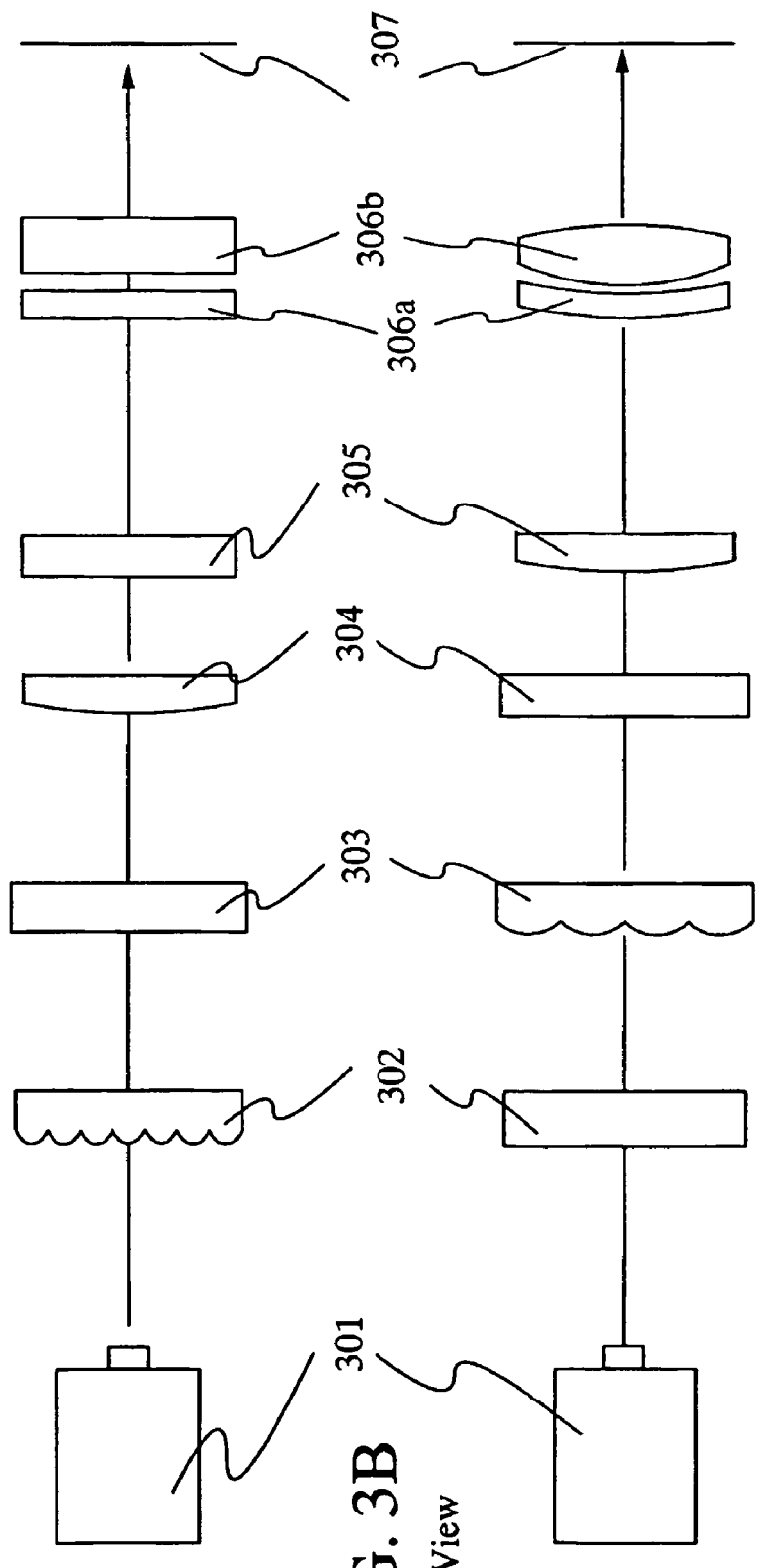
FIG. 3A Top View
FIG. 3B Side View

Top View

Side View

LASER ANNEALING METHOD WHEREIN REFLECTED BEAMS ARE MINIMIZED

TECHNICAL FIELD

The present invention relates to laser irradiation method and apparatus which are preferable, for example, for crystallizing an amorphous semiconductor film, which can keep stability of a laser oscillator high, and which can deliver a homogeneous laser beam. Moreover, the present invention relates to a method for annealing a non-single crystal and to a method for manufacturing a semiconductor device which use the homogenous laser beam. More specifically, the present invention relates to laser irradiation method and apparatus which can keep stability of a laser oscillator high and deliver a homogeneous laser beam, by avoiding an adverse effect due to return light reflected on an irradiation object when an amorphous semiconductor film is, for example, crystallized using a lens array such as a cylindrical lens array or a fly-eye lens. The present invention further relates to a method for annealing a non-single crystal and a method for manufacturing a semiconductor device which use the homogeneous laser beam.

BACKGROUND ART

In recent years, a technique for manufacturing a thin film transistor (hereinafter referred to as a TFT) over a substrate has been developed drastically, and application to an active matrix display device has been advanced. In particular, a TFT formed using a poly-crystalline semiconductor film is superior in field-effect mobility to a TFT formed using a conventional amorphous semiconductor film, and therefore high-speed operation is possible when the TFT is formed using the poly-crystalline semiconductor film. For this reason, it has become possible that a circuit for driving a pixel, which has been conventionally mounted by an external IC chip, is formed over the same substrate as the pixel by using the TFTs.

A poly-crystalline semiconductor film, which is suitable for manufacturing the TFT, is obtained by crystallizing an amorphous semiconductor film. To crystallize the amorphous semiconductor film, a laser annealing method is generally employed in recent years. This is because general thermal annealing requires 600° C. or more while an inexpensive glass substrate is inferior in heat resistance and easy to deform due to the heat. That is to say, the laser annealing method has advantages that the processing time can be shortened drastically compared with another annealing method using radiant heat or conductive heat and that a semiconductor substrate or a semiconductor film over a substrate can be heated selectively and locally so that almost no thermal damage is given to the substrate. Therefore, the laser annealing method is widely used to crystallize the amorphous semiconductor film formed over the glass substrate.

The laser annealing method described herein includes a technique to recrystallize an amorphous layer or a damaged layer formed in a semiconductor substrate or a semiconductor film, a technique to crystallize an amorphous semiconductor film formed over a substrate, and a technique to anneal a poly-crystalline semiconductor film. In addition, a technique to flatten or modify the surface of a semiconductor substrate or a semiconductor film is also included. As an example of the laser annealing method, a method is given in which a laser beam emitted from a pulsed laser, typically an excimer laser, is shaped into a square spot having a length of several cm on a side or a linear spot having a length of 100 mm or more on an irradiation surface by an optical system, and the irradiation position of the laser beam is moved relative to an irradiation object (see Reference 1: Japanese Patent Document Laid-Open No. H08-088196).

It is noted that the term of linear herein used does not mean a line in a strict sense but means a rectangle having a large aspect ratio (or an oblong). For example, a rectangle having an aspect ratio of 2 or more (preferable in the range of 10 to 10000) is referred to as a line. A laser beam whose spot shape is rectangular (hereinafter referred to as a rectangular beam) on an irradiation surface may be regarded to be included in a linear beam. The laser beam is shaped into a linear spot in order to secure enough energy density to perform sufficient annealing to an irradiation object, and the beam spot may have a rectangular or planar shape as long as sufficient annealing can be performed to the irradiation object.

Since the excimer laser has high output power and a wavelength which is sufficiently absorbed in a silicon film, which is used as a semiconductor film, the excimer laser is usually used in a laser annealing step. However, the excimer laser has a problem in that it becomes more difficult to keep its stability as the laser has higher output power. Therefore, in order to anneal the irradiation surface homogeneously, it is necessary to keep the stability of the laser oscillator high.

As a more specific method for performing homogeneous laser annealing while keeping the stability high, a method is known in which intensity distribution of a laser beam emitted from a laser oscillator is homogenized on an irradiation surface in such a way that the laser beam is divided using a lens array typified by a cylindrical lens array and then the divided beams are combined using a condensing lens. The cylindrical lens array is an optical system in which a plurality of cylindrical lenses are arranged vertically or horizontally. As another example of the lens array, a fly-eye lens is given in which a plurality of spherical lenses are arranged vertically and horizontally.

Thus, the laser beam is divided using such a lens array so that a portion of the laser beam having high intensity distribution is dispersed, and the divided beams are combined using the condensing lens so that the intensity distribution is homogenized on the irradiation surface. However, when the irradiation object has high reflectivity to the laser beam, the laser beam reflected on the irradiation object returns to the laser oscillator as so-called return light. The return light causes adverse effects that the output power and frequency of the laser beam fluctuate and that the rod of the laser oscillator is damaged, which results in unstable oscillation of the laser beam.

DISCLOSURE OF INVENTION

The present inventor has succeeded in developing means for preventing the return light from reaching the laser oscillator by making efforts to overcome the above problems. Consequently, it is an object of the present invention to provide laser irradiation method and apparatus which can keep stability of a laser oscillator high and which can perform laser annealing homogeneously to a processing object, for example a semiconductor film formed over a substrate, and to provide a crystallization method and a method for manufacturing a semiconductor device which use the laser irradiation apparatus.

As described above, the present invention is to provide laser irradiation method and apparatus, and a method for crystallizing a non-single crystal and a method for manufacturing a semiconductor device which use the laser irradiation method and apparatus. Among these methods, the laser irradiation method wherein return light is blocked comprises the steps of dividing a laser beam emitted from a laser oscillator into a plurality of beams using a lens array, making the divided beams pass through opening portions of a slit at positions where the divided beams are focused, and irradiating the laser beam to an irradiation surface using a condensing lens. The laser irradiation apparatus wherein return light is blocked comprises a laser oscillator, a lens array for dividing a laser beam emitted from the laser oscillator into a plurality of beams, a slit having opening portions through which the divided beams pass at positions where the divided beams are focused, a condensing lens for condensing the divided beams after passing through the slit, and a stage for having an irradiation surface set thereover where the laser beam having passed through the condensing lens is irradiated.

Then, the method for annealing a non-single crystal by laser irradiation in which return light is blocked comprises the steps of dividing a laser beam emitted from a laser oscillator into a plurality of beams using a lens array, making the divided beams pass through opening portions of a slit at positions where the divided beams are focused, and delivering the laser beam to a non-single crystal after passing through a condensing lens. Moreover, the method for manufacturing a semiconductor device wherein laser irradiation is performed while blocking return light comprises the steps of dividing a laser beam emitted from a laser oscillator using a lens array, making the divided beams pass through opening portions of a slit at positions where the divided beams are focused, and delivering the laser beam to anneal a non-single crystal after passing through a condensing lens.

The present invention is to provide a technique of laser irradiation in which a laser beam emitted from a laser oscillator is divided using a lens array typified by a cylindrical lens array, and then the divided beams are condensed using a condensing lens so that the energy intensity distribution of the laser beam can be homogenized on an irradiation surface.

According to the present invention, a slit is provided so that its opening portions are adjusted to focal points of the respective lenses constituting a lens array. The slit blocks return light so as to prevent the fluctuation of the output power and frequency of the laser beam and the damage of the rod and to stabilize the output power of the laser beam. Thus, the present invention has beneficial effects in crystallizing a semiconductor film. By using the slit according to the present invention, a laser beam having stably homogeneous intensity distribution can be delivered to the irradiation surface, and homogeneous annealing can be performed.

Further, the laser beam reflected on the irradiation object, that is, the return light, usually scatters in various directions, and it is rare that the return light is focused at the same position as the focal point of the laser beam having passed through the lens array. Therefore, only the focal points of the cylindrical lens array pass through the opening portions of the slit, and the other parts are blocked. As a result, most of the return light can be blocked by using the slit.

Furthermore, on this point, when the condition of the slit is optimized in accordance with the lens array in order to prevent the return light, for example the width of the opening portion is made as narrow as possible, only the focal points of the light having passed through of the lens array can pass through the slit, and a large part of the return light can be blocked. By blocking the return light more, it is possible to prevent the fluctuation of the output power and frequency of the laser and the damage of the rod and to stabilize the output power of the laser beam. This makes it possible to deliver a laser beam having stably homogeneous intensity distribution to an irradiation surface and to perform homogenous annealing.

BRIEF DESCRIPTION OF DRAWINGS

In the accompanying drawings:

FIGS. 3A and 3B show an example of a laser irradiation apparatus according to the present invention;

BEST MODE FOR CARRYING OUT THE INVENTION

Embodiment Mode

Figures 1A, 1B:
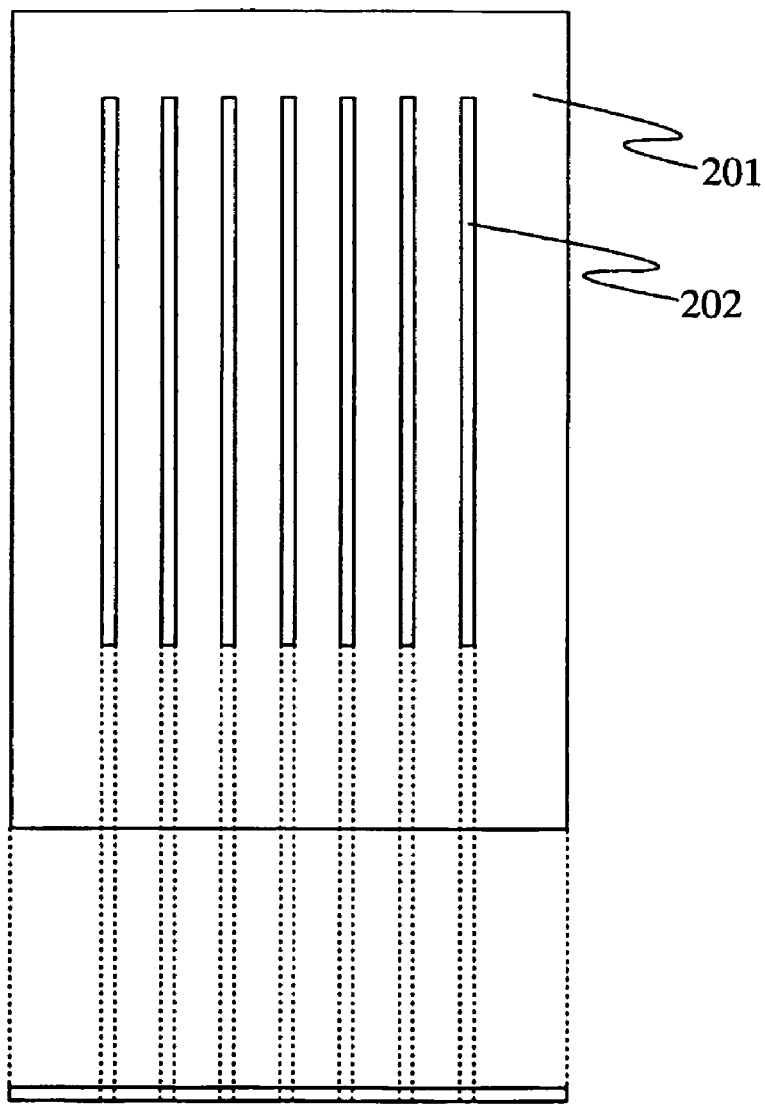
FIGS. 1A and 1B show an example of a slit used in the present invention.

Embodiments including the best mode for carrying out the present invention are hereinafter described. However, it is obvious that the present invention is not limited to the description but specified by the scope of claims.

According to the present invention, as described above, a laser beam emitted from a laser oscillator is divided into a plurality of beams using a lens array, the divided beams pass through opening portions of a slit at positions where the divided beams are focused, and the laser beam is irradiated to the irradiation surface using a condensing lens.

According to the present invention, by using the slit as described above, the return light reflected on the irradiation object is blocked so as to prevent the fluctuation of the output power and frequency of the laser and the damage of the rod. As a result, the output power of the laser is stabilized. This makes it possible to deliver a laser beam having stably homogeneous intensity distribution to an irradiation surface and to perform homogeneous annealing.

More specific description is hereinafter made on this point. As means for homogenizing the intensity distribution of a laser beam emitted from a laser oscillator on an irradiation surface, a method is given in which a lens array typified by a cylindrical lens array is used to divide the laser beam and then the divided beams are combined using a condensing lens. The present invention is also a technique belonging to this category.

A typical example of the lens array is a cylindrical lens array as mentioned above. The cylindrical lens array is an optical system in which a plurality of cylindrical lenses are arranged vertically or horizontally, that is, the cylindrical lenses are arranged so that generating lines of the cylindrical lenses are parallel to each other in a horizontal direction or a vertical direction. As another example of the lens array, a fly-eye lens is given in which spherical lenses are arranged vertically and horizontally. The fly-eye lens is also applicable as the lens array in the present invention. When the laser beam is divided using such a lens array, a portion of the laser beam having high intensity is dispersed, and then the divided beams are combined using a condensing lens. Thus, the intensity distribution of the laser beam can be homogenized on the irradiation surface.

However, when an irradiation object has high reflectivity to a laser beam, the laser beam reflected on the irradiation object returns to the laser oscillator as so-called return light. The return light causes the output power and frequency of the laser beam to fluctuate and damages the rod of the laser, thereby causing a problem that laser oscillation becomes unstable.

In view of the above problem, the present invention is to provide laser irradiation method and apparatus in which a slit is provided in accordance with a lens array so as to prevent return light from reaching a laser oscillator as described above, and a method for crystallizing a non-single crystal and a method for manufacturing a semiconductor device which use the laser irradiation method and apparatus.

As thus described, since the lens array is an arrangement of a plurality of lenses, the laser beams having passed through the lens array are focused at a plurality of points. Therefore, a plurality of opening portions are provided in the slit, and the slit is set so that the opening portions are adjusted to the focal points of the respective lenses constituting the lens array. It is rare that the return light is focused at the same point as the focal point of the laser beam which has passed through the lens array, and the return light usually scatters in various directions. Therefore, most of the return light can be blocked by making only the focal points of the cylindrical lens array pass through the opening portions of the slit and blocking the other parts.

Figure 2B:
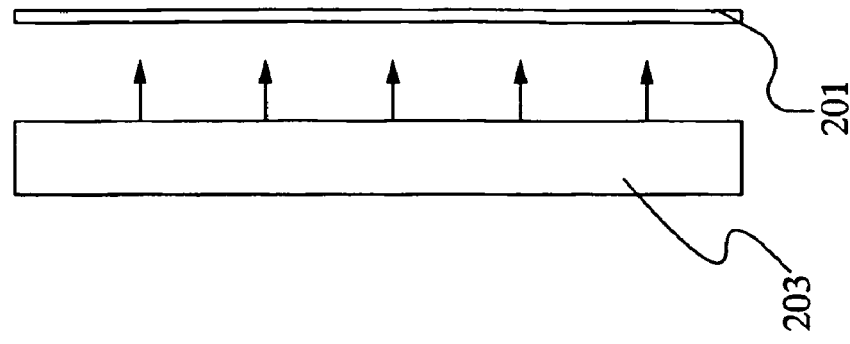
FIGS. 2A and 2B show the positional relation between a cylindrical lens array and a slit, and the function of the slit in the present invention.
Figure 2A:
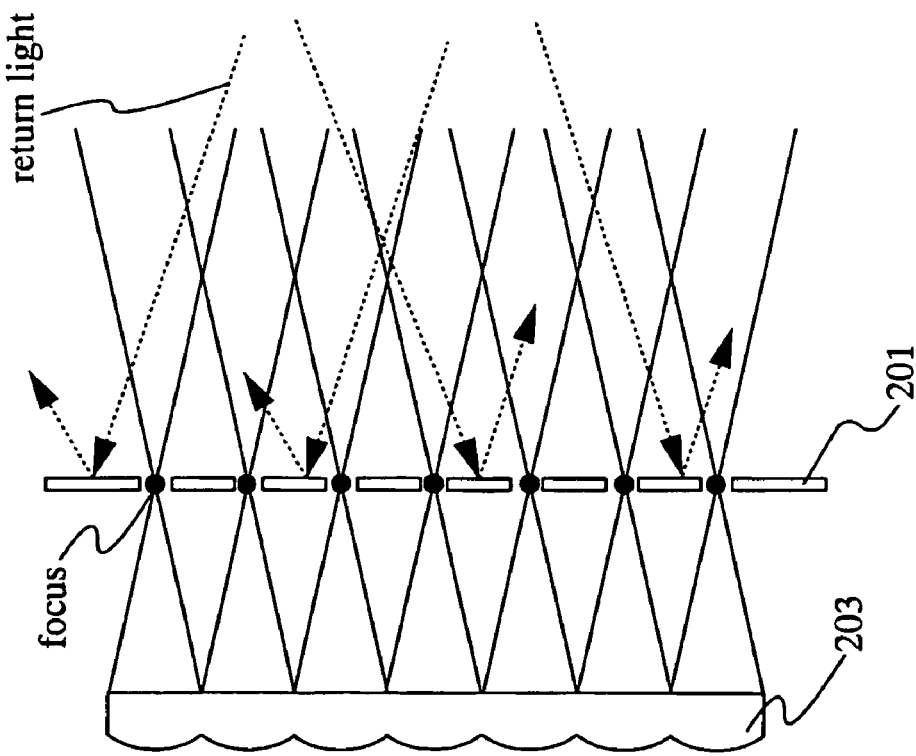

FIGS. 1A and 1B show an example of a slit according to the present invention. The sizes of a slit 201 and each opening portion 202, the interval of the opening portions 202, the direction of arranging the opening portions 202, and the like are optimized appropriately in accordance with a lens array to be used. The slit 201 shown in FIGS. 1A and 1B has been optimized in accordance with a cylindrical lens array 203 shown in FIGS. 2A and 2B. FIGS. 2A and 2B are top and side views respectively, which show the constitution of the slit 201 provided to a cylindrical lens array 203 including seven cylindrical lenses. In this case, since seven cylindrical lenses are arranged, the laser beams having passed through the cylindrical lens array 203 are focused at seven points.

The interval and width of each opening portion 202 of the slit 201 are adjusted and optimized so that only the focal points of the laser beams having passed through the cylindrical lens array 203 pass through the opening portions 202. The slit 201 shown in FIGS. 2A and 2B has seven opening portions because seven focal points are formed by the cylindrical lens array 203. The width of each opening portion is set so that the laser beam can pass through the opening portion, and the width preferably ranges from 0.1 to 3 mm. Thus, the number of opening portions is determined so as to be the same as that of the focal points of the laser beams having passed through the cylindrical lens array 203, and a large part of the return light can be blocked. Therefore, it is possible to prevent the adverse effects of instability of the laser oscillation and the like due to the returning of light to the laser oscillator.

The slit used in the present invention is not limited to that shown in FIGS. 1A and 1B. That is to say, when it is assumed that the cylindrical lens array 203 shown in FIGS. 2A and 2B divides the laser beam in a horizontal direction, another slit which has been optimized can be used to correspond to a cylindrical lens array which divides the laser beam in a vertical direction.

Figure 4A:
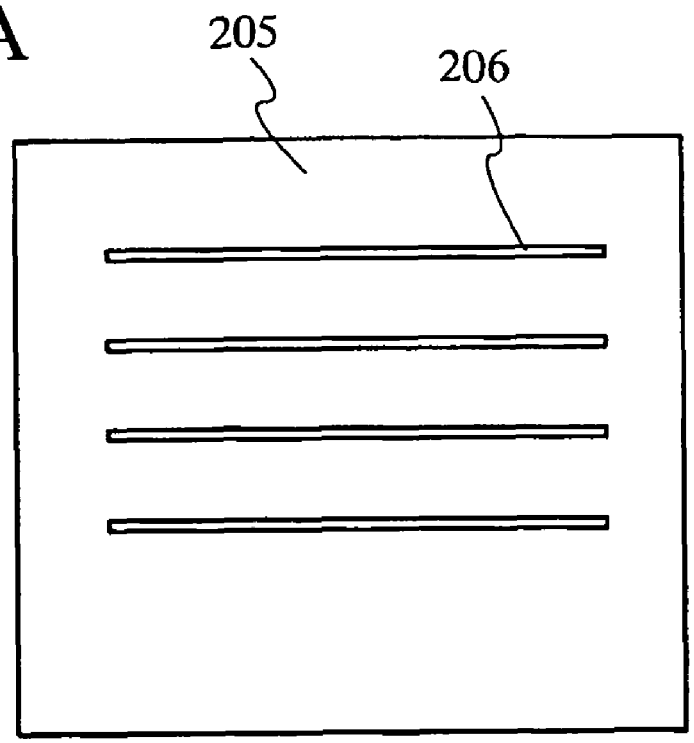
FIGS. 4A and 4B show examples of slits used in the present invention.

For example, a slit 205 in which opening portions 206 are arranged in the vertical direction as shown in FIG. 4A can be used. Further, when a fly-eye lens having spherical lenses arranged vertically and horizontally is used as the lens array, a slit 207 in which square opening portions 208 are arranged vertically and horizontally is preferably used to correspond to the fly-eye lens. It is to be noted that the shape of each opening portion 208 is not limited to the square, and the shape may be circular, polygon, or the like. It is preferable to use these slits in combination, because more return light can be blocked, which brings more advantageous effect.

Laser annealing to a semiconductor film, which is the best mode for carrying out the present invention, is further described hereinafter with reference to FIGS. 3A and 3B. As described in the background art, the laser annealing described in the present invention includes the technique to recrystallize an amorphous layer or a damaged layer formed in a semiconductor substrate or a semiconductor film, the technique to crystallize an amorphous semiconductor film formed over a substrate, and the technique to anneal a poly-crystalline semiconductor film.

FIGS. 3A and 3B show an example of a laser irradiation apparatus of the present invention. Laser annealing is performed by irradiating a semiconductor film as an irradiation surface with a pulsed excimer laser employed as a laser oscillator 301. A laser beam emitted from the laser oscillator 301 is shaped into a beam which is rectangular (hereinafter referred to as a rectangular beam) on an irradiation surface 307 using an optical system shown in FIGS. 3A and 3B, and laser annealing is performed with the rectangular beam.

In FIG. 3A, the rectangular beam formed on the irradiation surface 307 has a short side in a direction perpendicular to the paper. As shown in FIG. 3A, a laser beam emitted from the laser oscillator 301 is divided into seven beams in a long-side direction of the rectangular beam formed on the irradiation surface 307 by a cylindrical lens array 302, and the divided beams are combined by a cylindrical lens 304. Thus, the intensity distribution of the rectangular beam in the long-side direction is homogenized by dividing and combining the laser beam. The length of the laser beam in the long-side direction is determined by the cylindrical lens 304.

Meanwhile in FIG. 3B, after dividing the laser beam into four beams in a short-side direction of the rectangular beam by a cylindrical lens array 303, the divided beams are combined by a cylindrical lens 305 so that the intensity distribution of the laser beam in the short-side direction is homogenized.

After that, the length of the laser beam in the short-side direction is determined by a doublet cylindrical lens 306 including cylindrical lenses 306a and 306b, and then the laser beam is irradiated to the irradiation surface 307.

Thus, a rectangular beam having homogeneous intensity distribution is formed on the irradiation surface 307.

At the laser irradiation, the laser beam reflected on the semiconductor film, which is the irradiation object, reaches the laser oscillator as return light. In order to prevent the return light from affecting the laser oscillation, a slit is employed according to the present invention. This is the characteristic of the present invention.

The slit has a constitution shown in FIGS. 1A and 1B, and its function and positional relation to the cylindrical lens array are shown in FIGS. 2A and 2B. The slit is provided at the focal point of the cylindrical lens array 302. The laser beam emitted from the laser oscillator 301 passes through the cylindrical lens array 302, and then the laser beam travels through the slit 201 while being focused at the opening portion as shown with a solid line in FIGS. 2A and 2B. By blocking the other parts, most of the return light can be blocked as shown with a dotted line.

According to the present invention, the return light can be blocked more effectively by actively contriving the arrangement of the slit and the like, and more specific description is made on this point.

As shown in FIGS. 2A and 2B, the laser beam which has passed through the cylindrical lens array 203 travels through the slit 201 while being focused at the opening portion, the laser beam is condensed by a condensing lens so that the beam becomes parallel, and the laser beam is irradiated to the irradiation surface. In such a case, the return light reflected on the irradiation object travels in a direction symmetric along the axis of the condensing lens. For this reason, when the center axis of the cylindrical lens array is corresponded to the center axis of the condensing lens, the return light is also focused at another opening portion of the slit. Consequently, in this case, the returning of light to the laser oscillator cannot be blocked.

However, when using this point conversely, that is, the cylindrical lens array and the condensing lens are arranged so that their center axes do not correspond to each other, it is possible to prevent almost perfectly the return light from returning to the laser oscillator and to suppress the adverse effect due to the return light effectively.

Figure 6:
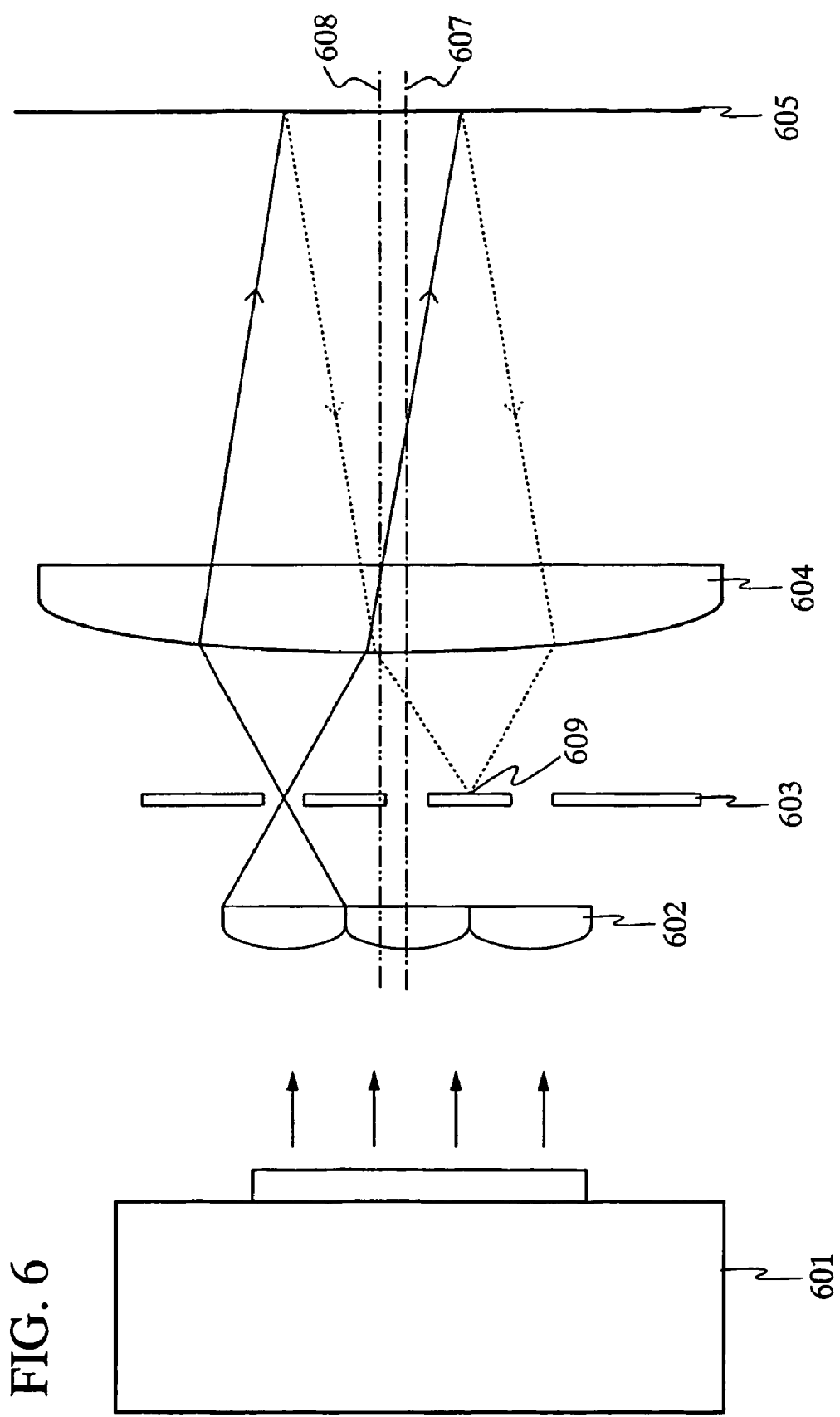
FIG. 6 shows a mode of preventing return light from entering a laser oscillator by contriving the positional relation between a slit and a condensing lens.

Specific description is made on this point with reference to FIG. 6. In FIG. 6, a laser beam emitted from a laser oscillator 601 is divided into a plurality of beams using a cylindrical lens array 602. The divided beams travel through a slit 603 having opening portions at focal points of the cylindrical lens array 602, and then enter a cylindrical lens 604.

The divided beams are condensed in the same region on an irradiation object 605 by the cylindrical lens 604. Thus, the intensity of the laser beam can be homogenized. In this figure, the center axis of the cylindrical lens array 602 is drawn with a dash dot line 607, while the center axis of the cylindrical lens 604 is drawn with a dash double dot line 608.

When the laser beam having passed through the cylindrical lens 604 is parallel as shown with a solid line in FIG. 6, the return light drawn with a dotted line in the figure travels in a direction symmetric along the axis of the condensing lens. The return light passes through the cylindrical lens 604 while remaining parallel, and is focused at a focal point 609 on the slit 603. Therefore, when the cylindrical lens array 602 and the cylindrical lens 604 are arranged so that their center axes correspond to each other, there is a risk that the return light cannot be blocked.

However, when the cylindrical lens array 602 and the cylindrical lens 604 are displaced so that their center axes do not correspond to each other as shown in FIG. 6, the focal point 609 is formed on a part of the slit 603 where the opening portions are not formed, and therefore, the return light can be blocked.

As thus described, it is possible to block the return light more effectively by selecting the positional relation and the constitution of the slit and the like according to the present invention.

Moreover, another mode is hereinafter described in which the damage due to the return light can be effectively suppressed by selecting the lens.

Figure 7:
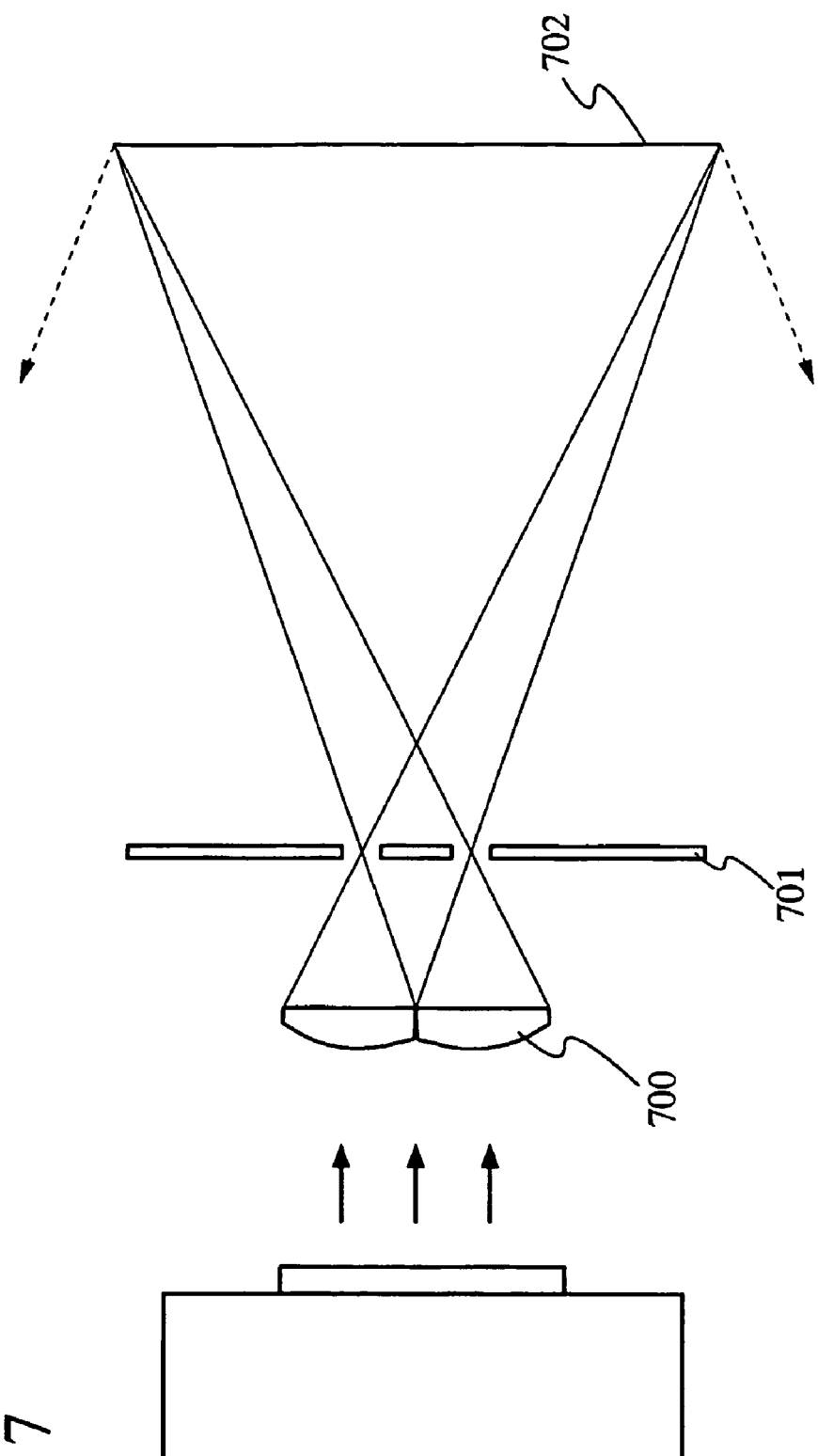
FIG. 7 shows a mode of preventing return light from entering a laser oscillator by using an off-axis lens.

In this mode, an off-axis lens shown in FIG. 7 is used. An off-axis cylindrical lens array 700 to be used here includes a plurality of cylindrical lenses each of which does not have a center axis of the curvature in the center of the curved plane. The off-axis cylindrical lens array 700 is designed so that the beams divided by the lens array are condensed in the same region on the irradiation surface. With this lens array, it is possible to homogenize the intensity of the laser beam by condensing the divided beams in the same region.

In the case of using such an off-axis cylindrical lens array 700, the divided beams do not become parallel but keep expanding. For this reason, the laser beam reflected on an irradiation surface 702 returns to the side of the laser oscillator while keeping the same divergence angle. Therefore, it is possible to block a large amount of the return light effectively by providing the slit 701 which has the opening portions only at the focal points of the off-axis cylindrical lens array 700.

According to the present invention, thus, homogeneous laser annealing can be performed by stabilizing the output power of the laser beam. When the laser annealing is performed to a non-single crystal semiconductor film as an irradiation object, it is possible to crystallize the semiconductor film, to enhance the crystallinity so as to obtain a crystalline semiconductor film having uniform crystallinity, and to activate an impurity. Further, with the crystalline semiconductor film, for example an active matrix type display can be manufactured by a practitioner according to a known method appropriately.

Embodiment 1

Laser irradiation method and apparatus according to the present invention are described more specifically in this embodiment. However, the present invention is not limited by this embodiment but specified by the scope of claims.

The laser irradiation apparatus shown in FIGS. 3A and 3B is used in Embodiment 1 similarly to the embodiment mode. In this embodiment, slits are provided not only to the cylindrical lens array 302 but also to the cylindrical lens array 303. The cylindrical lens array 303 has four cylindrical lenses arranged vertically, and the slit needs to be optimized in accordance with the cylindrical lens array 303. FIG. 4A shows a slit optimized in accordance with the cylindrical lens array 303.

A slit 205 shown in FIG. 4A has four opening portions 206 arranged vertically and is provided at a focal point of the cylindrical lens array 303 in FIGS. 3A and 3B. It is to be noted that the slit is not illustrated in FIGS. 3A and 3B.

Thus, more of the return light can be blocked by providing two slits in total in the vertical and horizontal directions. Because, even in the case where the return light passes through the opening portion of the slit provided in the horizontal direction in the cylindrical lens array 303, the return light can be blocked by the slit provided in the vertical direction in the cylindrical lens array 302.

Thus, the output power of the laser beam is stabilized by blocking the return light according to the present invention, and the intensity distribution can be homogenized stably on the irradiation surface.

Embodiment 2

Embodiment 2 describes an example of employing a fly-eye lens as the lens array. Specifically, a laser irradiation apparatus is described with reference to FIGS. 4B to 5B in which a laser beam is divided by a fly-eye lens and the divided beams are combined by a spherical lens so that the intensity distribution is homogenized, wherein a slit is used to prevent the return light.

Figures 5A, 5B:
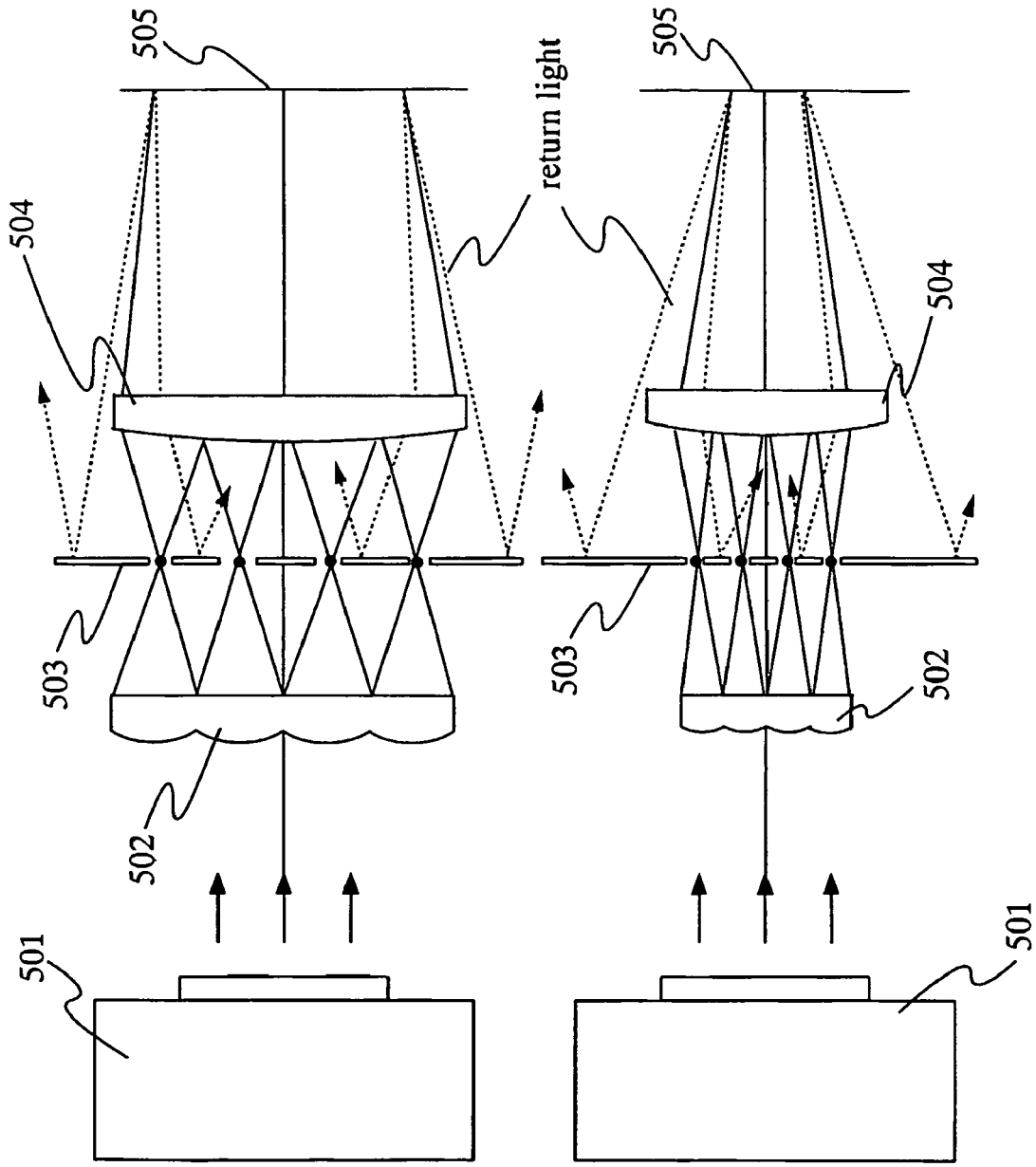
FIGS. 5A and 5B show an example of using a fly-eye lens in a laser irradiation apparatus according to the present invention.

In FIGS. 5A and 5B, a laser oscillator 501 is an excimer laser. A laser beam emitted from the laser oscillator 501 is divided vertically and horizontally by a fly-eye lens 502. This is illustrated in both of FIGS. 5A and 5B, which show a top view and a side view respectively.

As is clear from both figures, specifically the fly-eye lens 502 has four rectangular spherical lenses arranged vertically and has four rectangular spherical lenses arranged horizontally. Therefore, 16 focal points are formed at which the portion having high intensity is dispersed. After passing through a slit 503, the divided beams are combined using a spherical lens 504, and then the combined beam is delivered to an irradiation surface 505 with the intensity distribution homogenized. Since each spherical lens of the fly-eye lens 502 is rectangular, a beam spot formed on the irradiation surface 505 is rectangular. In order to secure energy in the rectangular beam spot required to anneal a semiconductor film, it is preferable to use an excimer laser having high output power such as an excimer laser manufactured by SOPRA, Inc.

In this case, when a semiconductor film having high reflectivity to the excimer laser is used as the irradiation surface, the laser beam is reflected on the semiconductor film and returns to the laser oscillator 501 as return light. The optical path of this return light is drawn with a dotted line in FIGS. 5A and 5B. A slit is employed according to the present invention in order to prevent the return light from affecting the laser oscillator.

Figure 4B:
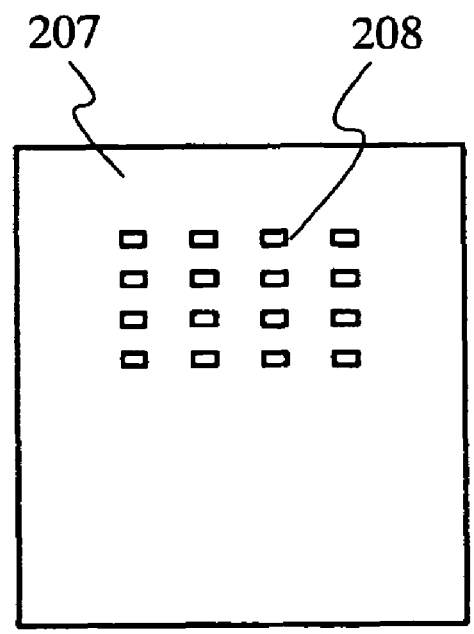

The slit 207 shown in FIG. 4B has been optimized in accordance with the fly-eye lens 502. With this slit, almost all the return light can be blocked so that the output power of the laser beam is stabilized.

Thus, for example when laser annealing is performed to a semiconductor film as the irradiation surface, the semiconductor film can be crystallized, the crystallinity can be enhanced so that a crystalline semiconductor film having uniform crystallinity is obtained, and an impurity element can be activated. Further, with the crystalline semiconductor film, for example an active matrix type display can be manufactured by a practitioner according to a known method.

Embodiment 3

This embodiment describes a method for manufacturing a semiconductor device according to the present invention using laser irradiation method and laser irradiation apparatus of the present invention with reference to FIGS. 8A to 9C. It is to be noted that, in addition to the mode of this embodiment, other modes which can be applied to the manufacturing process are also described.

Figure 8A:
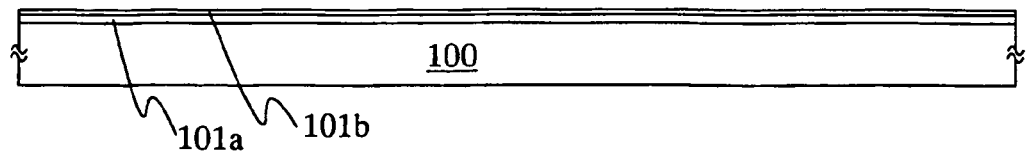
FIGS. 8A to 8D show a method for manufacturing a semiconductor device according to the present invention using a laser irradiation method according to the present invention.

First, base insulating films 101a and 101b are formed over a substrate 100 (FIG. 8A). A glass substrate is used as the substrate 100 in this embodiment. As other materials of the substrate 100, an insulating substrate such as a glass substrate, a quartz substrate, and a crystalline glass substrate, a ceramic substrate, a stainless steel substrate, a metal substrate (such as tantalum, tungsten, molybdenum, or the like), a semiconductor substrate, and a plastic substrate (such as polyimide, acrylic, polyethylene terephthalate, polycarbonate, or polyarylate, polyethersulfone) can be used. The substrate is formed with the material that can resist at least the heat generated in the process.

As the insulating films, in this embodiment, a silicon nitride oxide film is formed in 50 nm thick as a first base insulating film 101a, and a silicon oxynitride film is formed in 100 nm as a second base insulating film 101b. Alternatively, each of the base insulating films 101a and 101b formed over the substrate may be a silicon oxide film, a silicon nitride film, a silicon oxynitride film, or the like in a single-layer or multilayer structure. These films are formed by a known method such as a sputtering method, a reduced-pressure CVD method, or a plasma CVD method. Although the base insulating films are formed in a two-layer structure in the present embodiment, the base insulating film may be formed in a single-layer structure or in a multilayer structure of three or more layers. It is to be noted that the silicon nitride oxide film and the silicon oxynitride film are different in the proportion between nitrogen and oxygen. The former contains more nitrogen than the latter.

Next, an amorphous semiconductor film 102 is formed. In this embodiment, amorphous silicon is formed in 66 nm thick by a CVD method. The amorphous semiconductor film may be formed with silicon or a silicon-based material (for example, $Si_xGe_{1-x}$) in thickness from 25 to 80 nm by a known method such as the sputtering method, the reduced-pressure CVD method, or the plasma CVD method.

Figure 8B:
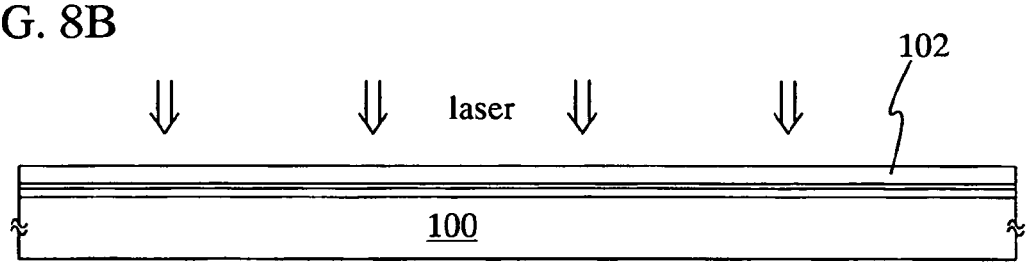

After that, the amorphous silicon film is crystallized (FIG. 8B). In the present embodiment, laser irradiation method and apparatus of the present invention are used to perform laser annealing for the crystallization. As the laser oscillator, a pulsed excimer laser is used. As shown in the above embodiment mode and embodiments, a slit is provided in order to block a beam (return light) reflected on the semiconductor film when irradiating the semiconductor film with the laser beam. By performing the laser irradiation thus, the output power of the laser beam can be stabilized so that a laser beam having homogeneous intensity distribution can be delivered.

After the crystallization by the laser annealing, etching is performed to form crystalline semiconductor films 102a to 102d having desired shapes.

Figure 8C:
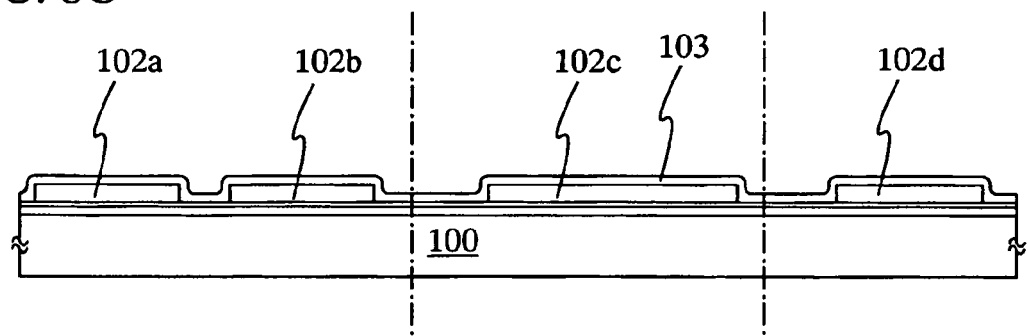

Subsequently, a silicon oxide film is formed as a gate insulating film 103 in this embodiment (FIG. 8C). The film thickness thereof is set to approximately 115 nm, and an insulating film including silicon may be formed as the gate insulating film 103 by the low-pressure CVD method, the plasma CVD method, the sputtering method, or the like.

Figure 8D:
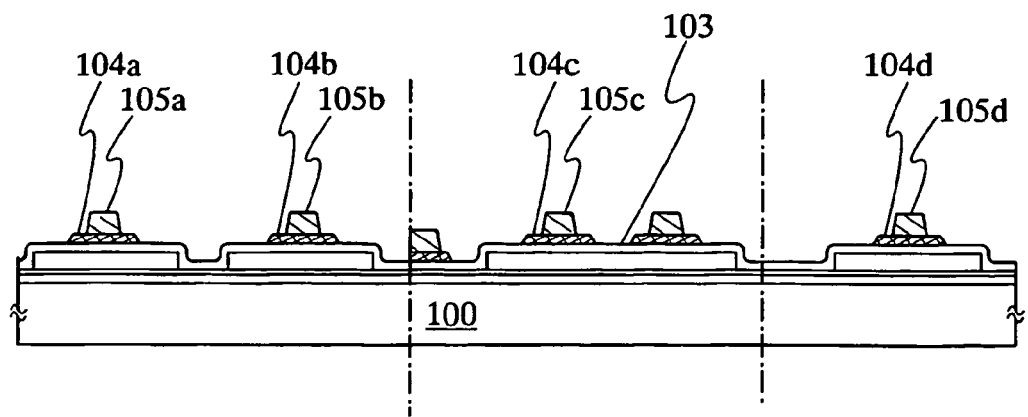

Next, a tantalum nitride (TaN) film having a thickness of 30 nm is formed over the gate insulating film as first conductive layers 104a to 104d, and a tungsten (W) film having a thickness of 370 nm is formed thereover as second conductive layers 105a to 105d (FIG. 8D). The TaN film may be formed by the sputtering method using Ta as a target in the atmosphere of nitrogen, while the W film may be formed by the sputtering method using W as a target.

Although this embodiment forms the first conductive layer using TaN in 30 nm thick and the second conductive layer using W in 370 nm thick, the materials of these conductive layers are not limited to these elements. Both of the first and the second conductive layers may be formed of the element selected from the group consisting of Ta, W, Ti, Mo, Al, Cu, Cr and Nd, or a compound material or an alloy material including the above element as its main component.

In addition, a semiconductor film, typically a poly-crystalline silicon film, doped with an impurity such as phosphorus may be also employed as the both conductive layers. Moreover, AgPdCu alloy can be also used. Furthermore, the combination of these may be selected appropriately. The film thickness of the first conductive layer is preferably in the range of 20 to 100 nm, and that of the second conductive layer is preferably in the range of 100 to 400 nm.

Although the present embodiment shows the two-layer structure, the conductive layer may be formed in a single-layer structure or a multilayer structure of three or more layers.

Next, by using a gate electrode or a patterned resist as a mask, an impurity imparting n-type or p-type conductivity is selectively added to the crystalline semiconductor films 102a to 102d so that a source region, a drain region, an LDD region, and the like are formed.

Figure 9A:
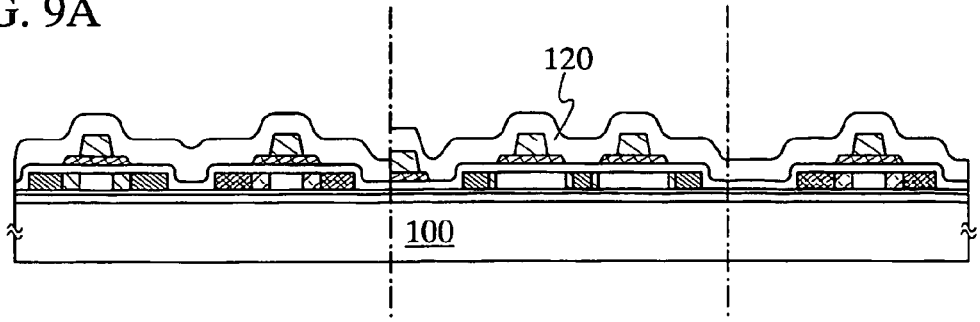
FIGS. 9A to 9C show a method for manufacturing a semiconductor device according to the present invention using a laser irradiation method according to the present invention.

After that, the resist mask is removed, and then a first passivation film 120 is formed (FIG. 9A). In this embodiment, a silicon oxynitride film is formed in 100 nm thick by a plasma CVD method. It is to be noted that an insulating film including silicon may be formed as the first passivation film in thickness of 100 to 200 nm by the plasma CVD method or the sputtering method. At this time, a silicon oxynitride film manufactured with $SiH_4$, $N_2O$, and $NH_3$ or a silicon oxynitride film manufactured with $SiH_4$ and $N_2O$ may be formed by the plasma CVD method. These silicon oxynitride films can be manufactured under the condition where the reaction pressure is set in the range of 20 to 200 Pa, the substrate temperature is set in the range of 300 to 400° C., and electrical power density is set in the range of 0.1 to 1.0 W/cm$^2$ at high frequency (60 MHz).

In addition, a silicon oxynitride hydride film manufactured with $SiH_4$, $N_2O$, and $H_2$ may be applied as the first passivation film.

Of course, the first passivation film 120 may be formed not only in the single-layer structure of the silicon oxynitride film as shown in this embodiment, but also in the single-layer structure of other insulating film including silicon or in the multilayer structure.

After that, the laser annealing is performed to recover the crystallinity of the semiconductor film and to activate the impurity element added in the semiconductor film. In this case, the slit is also provided in order to block the beam (return light) reflected on the semiconductor film similarly to the case of the crystallization. Thus, a laser beam having homogeneous intensity distribution can be delivered, and accordingly the present embodiment employs the slit.

Further, by performing heat treatment after forming the first passivation film 120, hydrogenation of the semiconductor film can be performed simultaneously with the activation process. The hydrogenation is to terminate dangling bonds in the semiconductor film with hydrogen included in the first passivation film.

Alternatively, the heat treatment may be performed before the first passivation film 120 is formed. However, when the materials of the first conductive layers 104a to 104d and the second conductive layers 105a to 105d are sensitive to heat, the heat treatment is preferably performed after forming the passivation film 120 in order to protect wirings and the like as shown in the present embodiment. When the heat treatment is performed before forming the passivation film 120, the hydrogenation utilizing the hydrogen included in the passivation film cannot be performed, because the passivation film does not exist in the heat treatment. In this case, the hydrogenation is performed by using hydrogen excited in plasma (plasma hydrogenation) or by heat treatment in the atmosphere including hydrogen by 3 to 100% at temperatures ranging from 300 to 450° C. for 1 to 12 hours.

Figure 9B:
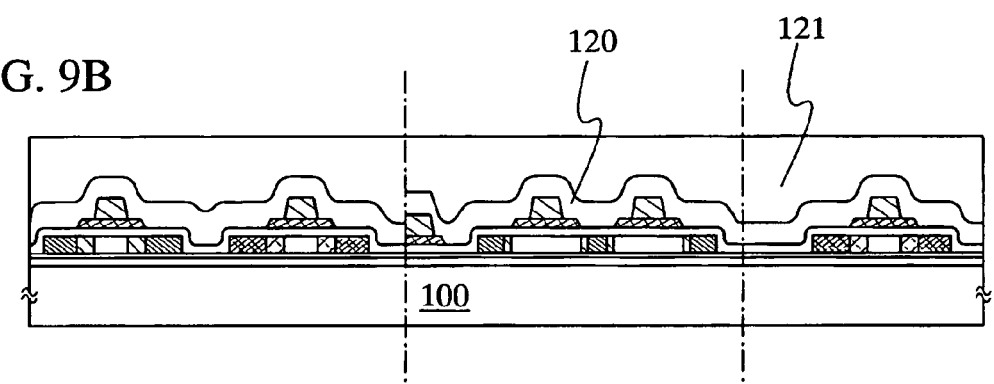

Next, an insulating film 121 is formed over the first passivation film 120 (FIG. 9B). A non-photosensitive acrylic film is formed in 1.6 μM in this embodiment (FIG. 9B). An inorganic insulating film or an organic insulating film may be used as the interlayer insulating film. A silicon oxide film formed by the CVD method or a silicon oxide film applied by an SOG (Spin On Glass) method can be used as the inorganic insulating film. A film of polyimide, polyamide, BCB (benzocyclobutene), acrylic, positive photosensitive organic resin, negative photosensitive organic resin, or the like can be used as the organic insulating film. A multilayer structure of an acrylic film and a silicon oxynitride film may be used.

The interlayer insulating film can be formed with a material whose skeletal structure is formed with a bond of silicon (Si) and oxygen (O) and which includes at least hydrogen in the substituent. The substituent can be formed with a material having at least one of fluorine, an alkyl group, and aromatic carbon hydride, and siloxane-based polymer is given as a typical example of these materials. As siloxane-based polymer, there are silica glass, alkylsiloxane polymer, alkylsilsesquioxane polymer, silsesquioxane hydride polymer, alkylsilsesquioxane hydride polymer, and the like according to their structures. Further, the interlayer insulating film may be formed with the material including polymer having a Si—N bond (polysilazane).

Although the interlayer insulating film is made so thinly, the interlayer insulating film can maintain its enough flatness and high insulating characteristic by employing the above material. For this reason, the interlayer insulating film can relax and flatten the concavity and convexity due to the TFT formed over the substrate. Since the interlayer insulating film is formed particularly for the purpose of flattening, it is preferable to use the insulating film formed of the material that can be easily flattened. Moreover, because the above material has high resistance against the heat, the interlayer insulating film that can resist through a reflow process in a multilayer wiring can be obtained. Furthermore, because it has low moisture-absorption characteristic, it is possible to form the interlayer insulating film having less dewatering volume.

After that, a second passivation film may be formed with a silicon nitride oxide film or the like over the interlayer insulating film. In this embodiment, a silicon oxynitride film is formed in 70 nm thick by the RF sputtering method. The film thickness is preferably in the range of approximately 10 to 200 nm, and the second passivation film prevents the moisture from entering the interlayer insulating film.

Not only the silicon nitride oxide film but also a silicon nitride film, an aluminum nitride film, an aluminum oxynitride film, a diamond-like carbon (DLC) film, or a carbon nitride (CN) film can be used similarly. The film formed by an RF sputtering method is a highly dense film and is superior in the barrier properties. In the case of forming a silicon oxynitride film, for example, the RF sputtering is performed under the condition where Si is used as a target, $N_2$, Ar, and $N_2O$ are flowed at gas flow rate of 31:5:4, the pressure is set to 0.4 Pa, and the electric power is set to 3000 W.

In the case of forming a silicon nitride film as the second passivation film, for example, Si is used as a target, $N_2$ an Ar are flowed at gas flow rate of 1:1 in the chamber, the pressure is set to 0.8 Pa, the electric power is set to 3000 W, and the film-forming temperature is set to 215° C.

Subsequently, the second passivation film, the interlayer insulating film, and the first passivation film are etched to form contact holes that reach the source and drain regions.

After that, wirings and electrodes 122 to 129 to connect electrically with the respective source and drain regions are formed. It is to be noted that these wirings are formed by patterning a multilayer of a 50-nm-thick Ti film and a 500-nm-thick alloy film (aluminum (Al) and titanium (Ti)). The wirings may be formed not only in a two-layer structure but also in a single-layer structure or in a multilayer structure of three or more layers. In addition, the wiring materials are not limited to aluminum (Al) and titanium (Ti). For example, the wirings may be formed by patterning a multilayer in which an aluminum (Al) film or a copper (Cu) film is formed over the TaN film, and then a titanium (Ti) film is further formed thereover.

Figure 9C:
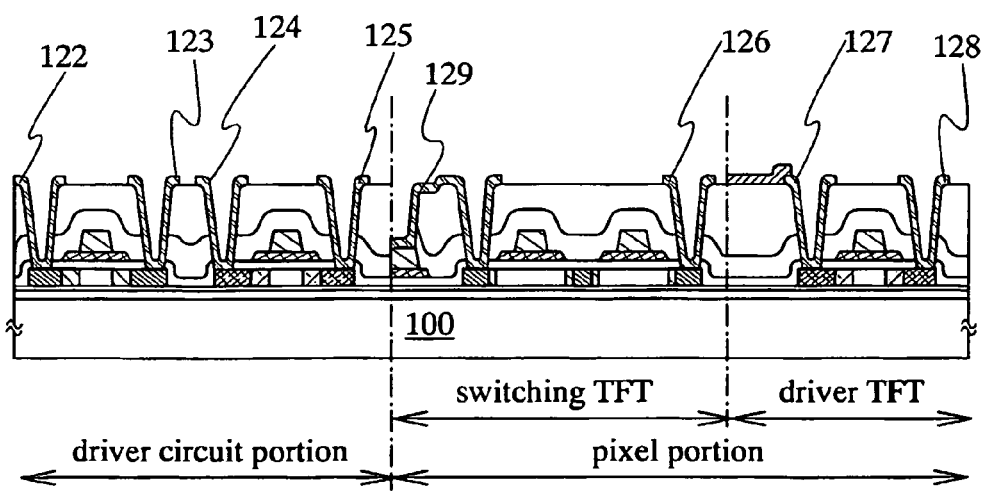

According to the above steps, a semiconductor device shown in FIG. 9C is completed.

The manufacturing method of the semiconductor device using the laser annealing method according to the present invention is not limited to the method for manufacturing a TFT described above. This embodiment can be freely combined with any one of the above embodiment mode and embodiments.

Embodiment 4

As electronic appliances using semiconductor devices manufactured by the manufacturing method according to the present invention with the use of the laser annealing method of the present invention, there are a camera such as a video camera and a digital camera, a goggle-type display (head mount display), a navigation system, a sound reproduction device (a car audio, an audio compo, and the like), a computer, a game machine, a mobile information terminal (a mobile computer, a mobile phone, a mobile game machine, an electronic book, and the like), an image reproduction device equipped with a recording medium (specifically a DVD (digital versatile disc)), and the like, all of which are devices for reproducing recording media and have displays for displaying the image.

FIGS. 10A to 10H show specific examples of these electronic appliances.

Figure 10A:
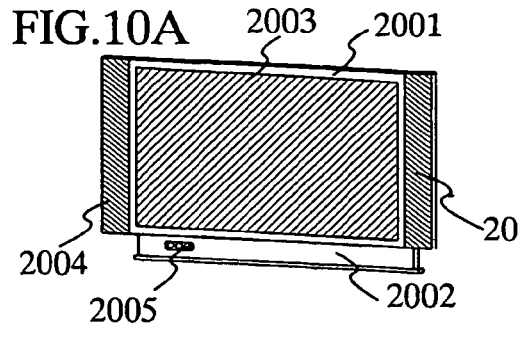
FIGS. 10A to 10H show electronic appliances with semiconductor devices built in, which are manufactured by a method for manufacturing a semiconductor device according to the present invention.

FIG. 10A shows a television receiving machine including a case 2001, a supporting stand 2002, a display portion 2003, speaker portions 2004, a video input terminal 2005, and the like. The television receiving machine can be manufactured by using a semiconductor device manufactured using a laser irradiation method according to the present invention in the display portion 2003.

Figure 10B:
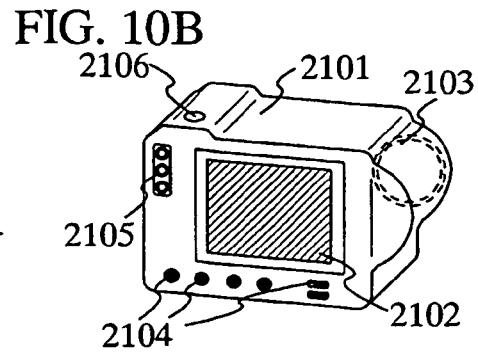

FIG. 10B shows a digital camera including a main body 2101, a display portion 2102, an image receiving portion 2103, operation keys 2104, an external connection port 2105, a shutter 2106, and the like. The digital camera can be manufactured by using a semiconductor device manufactured using a laser irradiation method according to the present invention in the display portion 2102, circuits, and the like.

Figure 10C:
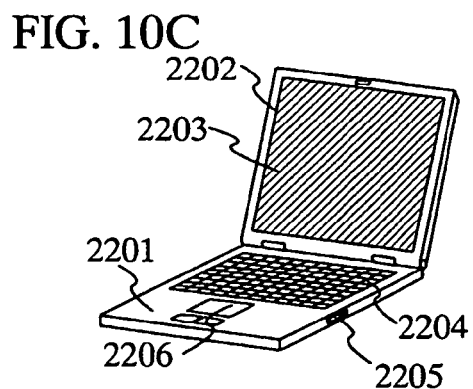

FIG. 10C shows a computer including a main body 2201, a case 2202, a display portion 2203, a keyboard 2204, an external connection port 2205, a pointing mouse 2206, and the like. The computer can be manufactured by using a semiconductor device manufactured using a laser irradiation method according to the present invention in the display portion 2203, circuits, and the like. The computer can be manufactured by applying a laser irradiation method according to the present invention in the display portion 2203, circuits, and the like.

Figure 10D:
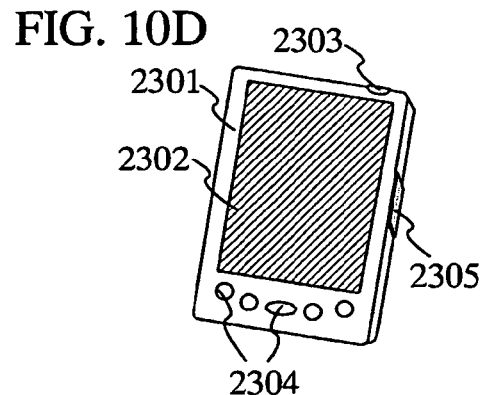

FIG. 10D shows a mobile computer including a main body 2301, a display portion 2302, a switch 2303, operation keys 2304, an infrared port 2305, and the like. The mobile computer can be manufactured by applying a laser irradiation method according to the present invention to the process of the display portion 2302, circuits, and the like.

Figure 10E:
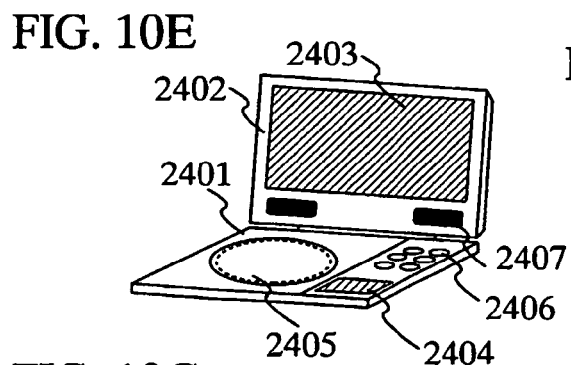

FIG. 10E shows a mobile image reproduction device equipped with a recording medium (for example a DVD reproduction device), including a main body 2401, a case 2402, a display portion A 2403, a display portion B 2404, a recording medium (such as a DVD) reading portion 2405, operation keys 2406, speaker portions 2407, and the like. The display portion A 2403 mainly displays image information, while the display portion B 2404 mainly displays text information. The image reproduction device can be manufactured by applying a laser irradiation method according to the present invention to the process of the display portions A 2403 and B 2404, circuits, and the like. It is to be noted that the image reproduction device equipped with the recording medium includes a game machine and the like.

Figure 10F:
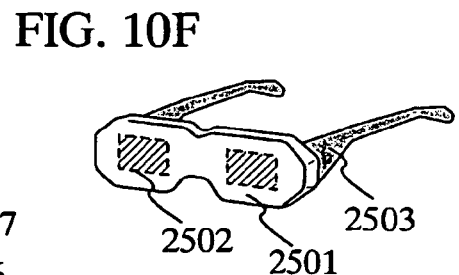

FIG. 10F shows a goggle type display (a head mount display) including a main body 2501, a display portion 2502, and an arm portion 2503. The goggle type display can be manufactured by applying a laser irradiation method according to the present invention to the display portion 2502, circuits, and the like.

Figure 10G:
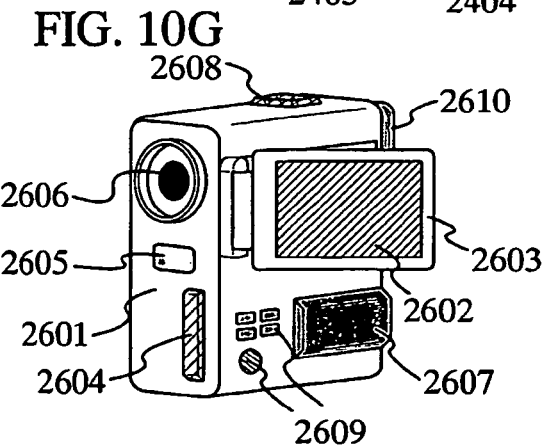

FIG. 10G shows a video camera including a main body 2601, a display portion 2602, a case 2603, an external connection port 2604, a remote controller receiving portion 2605, an image receiving portion 2606, a battery 2607, an audio input portion 2608, operation keys 2609, an eyepiece portion 2610, and the like. The video camera can be manufactured by applying a laser irradiation method according to the present invention to the display portion 2602, circuits, and the like.

Figure 10H:
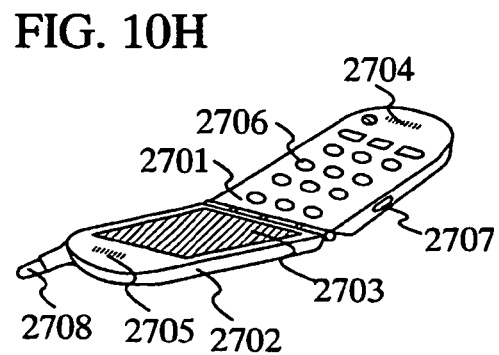

FIG. 10H shows a mobile phone including a main body 2701, a case 2702, a display portion 2703, an audio input portion 2704, an audio output portion 2705, operation keys 2706, an external connection port 2707, an antenna 2708, and the like. The mobile phone can be manufactured by applying a laser irradiation method according to the present invention to the display portion 2703, circuits, and the like.

In addition to the above electronic appliances, the present invention can be applied to a front-type or rear-type projector.

As thus described, the present invention can be applied in a wide range, and can be applied to electronic appliances of every field.

The invention claimed is:

1. A laser irradiation method comprising:
dividing a first laser beam emitted from a laser oscillator into a plurality of divided beams through a lens array;
providing a slit plate having a plurality of opening portions so that the plurality of opening portions are provided at focal points of respective lenses constituting the lens array; and
making each of the plurality of divided beams pass through a corresponding opening portion of the slit plate,
wherein a second laser beam which is reflected from an irradiation surface is blocked by the slit plate.

2. The laser irradiation method according to claim 1, wherein the lens array is a cylindrical lens array or a fly-eye lens.

3. The laser irradiation method according to claim 1, wherein a lens of the lens array is an off-axis lens.

4. A laser irradiation apparatus comprising:
a laser oscillator;
a lens array for dividing a first laser beam emitted from the laser oscillator into a plurality of divided beams;
a slit plate having a plurality of opening portions for making each of the plurality of divided beams pass through a corresponding opening portion of the slit plate, the plurality of opening portions provided at focal points of respective lenses constituting the lens array; and
a stage on which an irradiation object is mounted,
wherein a second laser beam which is reflected from a surface of the irradiation object is blocked by the slit plate.

5. The laser irradiation apparatus according to claim 4, wherein the lens array is a cylindrical lens array or a fly-eye lens.

6. The laser irradiation apparatus according to claim 4, wherein a lens of the lens array is an off-axis lens.

7. A method for annealing a non-single crystal comprising:
dividing a first laser beam emitted from a laser oscillator into a plurality of divided beams through a lens array;
providing a slit plate having a plurality of opening portions so that the plurality of opening portions are provided at focal points of respective lenses constituting the lens array;
making each of the plurality of divided beams pass through a corresponding opening portion of the slit plate; and
annealing the non-single crystal by irradiating a surface of the non-single crystal,
wherein a second laser beam which is reflected from the surface of the non-single crystal is blocked by the slit plate.

8. The method for annealing a non-single crystal according to claim 7 wherein the lens array is a cylindrical lens array or a fly-eye lens.

9. The method for annealing a non-single crystal according to claim 7, wherein a lens of the lens array is an off-axis lens.

10. A method for manufacturing a semiconductor device comprising:
forming a semiconductor film over a substrate;
dividing a first laser beam emitted from a laser oscillator into a plurality of divided beams through a lens array;
providing a slit plate having a plurality of opening portions so that the plurality of opening portions are provided at focal points of respective lenses constituting the lens array;
making each of the plurality of divided beams pass through a corresponding opening portion of the slit plate; and
annealing the semiconductor film by irradiating a surface of the semiconductor film,
wherein a second laser beam which is reflected from the surface of the semiconductor film is blocked by the slit plate.

11. The method for manufacturing a semiconductor device according to claim 10, wherein the lens array is a cylindrical lens array or a fly-eye lens.

12. The method for manufacturing a semiconductor device according to claim 10, wherein a lens of the lens array is an off-axis lens.

13. A laser irradiation method comprising:
dividing a first laser beam emitted from a laser oscillator into a plurality of divided beams through a lens array;
providing a slit plate having a plurality of opening portions so that the plurality of opening portions are provided at focal points of respective lenses constituting the lens array;
making each of the plurality of divided beams pass through a corresponding opening portion of the slit plate; and
condensing the plurality of divided beams through a condensing lens so as to overlap on an irradiation surface,
wherein a second laser beam which is reflected from the irradiation surface is blocked by the slit plate.

14. The laser irradiation method according to claim 13, wherein the lens array is a cylindrical lens array or a fly-eye lens.

15. The laser irradiation method according to claim 13, wherein a center axis of the lens array does not correspond to a center axis of the condensing lens.

16. The laser irradiation method according to claim 13, wherein a lens of the lens array is an off-axis lens.

17. A laser irradiation apparatus comprising:
a laser oscillator;
a lens array for dividing a first laser beam emitted from the laser oscillator into a plurality of divided beams;
a slit plate having a plurality of opening portions for making each of the plurality of divided beams pass through a corresponding opening portion of the slit plate, the plurality of opening portions are provided at focal points of respective lenses constituting the lens array;
a condensing lens for condensing the plurality of divided beams after passing the plurality of divided beams through the corresponding opening portion of the slit plate so as to overlap on a surface of an irradiation object; and
a stage on which the irradiation object is mounted,
wherein a second laser beam which is reflected from the surface of the irradiation object is blocked by the slit plate.

18. The laser irradiation apparatus according to claim 17, wherein the lens array is a cylindrical lens array or a fly-eye lens.

19. The laser irradiation apparatus according to claim 17, wherein a center axis of the lens array does not correspond to a center axis of the condensing lens.

20. The laser irradiation apparatus according to claim 17, wherein a lens of the lens array is an off-axis lens.

21. A method for annealing a non-single crystal comprising:
dividing a first laser beam emitted from a laser oscillator into a plurality of divided beams through a lens array;
providing a slit plate having a plurality of opening portions so that the plurality of opening portions are provided at focal points of respective lenses constituting the lens array;
making each of the plurality of divided beams pass through a corresponding opening portion of the slit plate;
condensing the plurality of divided beams through a condensing lens to produce a condensed laser beam so as to overlap on a surface of the non-single crystal; and
annealing the non-single crystal by irradiating the surface of the non-single crystal with the condensed laser beam,
wherein a second laser beam which is reflected from the surface of the non-single crystal is blocked by the slit plate.

22. The method for annealing a non-single crystal according to claim 21, wherein the lens array is a cylindrical lens array or a fly-eye lens.

23. The method for annealing a non-single crystal according to claim 21, wherein a center axis of the lens array does not correspond to a center axis of the condensing lens.

24. The method for annealing a non-single crystal according to claim 21, wherein a lens of the lens array is an off-axis lens.

25. A method for manufacturing a semiconductor device comprising:
forming a semiconductor film over a substrate;
dividing a first laser beam emitted from a laser oscillator into a plurality of divided beams through a lens array;
providing a slit plate having a plurality of opening portions so that the plurality of opening portions are provided at focal points of respective lenses constituting the lens array;
making each of the plurality of divided beams pass through a corresponding opening portion of the slit plate;
condensing the plurality of divided beams through a condensing lens to produce a condensed laser beam so as to overlap on a surface of the semiconductor film; and annealing the semiconductor film by irradiating the surface of the semiconductor film with the condensed laser beam, wherein a second laser beam which is reflected from the surface of the semiconductor film is blocked by the slit plate.

26. The method for manufacturing a semiconductor device according to claim 25, wherein the lens array is a cylindrical lens array or a fly-eye lens.

27. The method for manufacturing a semiconductor device according to claim 25, wherein a center axis of the lens array does not correspond to a center axis of the condensing lens.

28. The method for manufacturing a semiconductor device according to claim 25, wherein a lens of the lens array is an off-axis lens.

* * * * *